(12) United States Patent
Mohammed et al.

(10) Patent No.: US 9,842,745 B2
(45) Date of Patent: Dec. 12, 2017

(54) HEAT SPREADING SUBSTRATE WITH EMBEDDED INTERCONNECTS

(71) Applicant: Invensas Corporation, San Jose, CA (US)

(72) Inventors: Ilyas Mohammed, Santa Clara, CA (US); Masud Beroz, Apex, NC (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/600,595

(22) Filed: Jan. 20, 2015

(65) Prior Publication Data

US 2015/0132894 A1    May 14, 2015

Related U.S. Application Data

(62) Division of application No. 13/399,941, filed on Feb. 17, 2012, now Pat. No. 8,946,757.

(51) Int. Cl.
  *H01L 21/48* (2006.01)
  *H01L 23/14* (2006.01)
  (Continued)

(52) U.S. Cl.
  CPC ........ *H01L 21/4853* (2013.01); *H01L 21/486* (2013.01); *H01L 21/52* (2013.01);
  (Continued)

(58) Field of Classification Search
  CPC ..... H01L 23/142; H01L 21/486; H01L 24/97; H01L 23/49568; H01L 21/4853; H01L 21/52; H01L 21/768; H01L 2224/45139; H01L 2924/01322; H01L 2924/12041; H01L 2924/19107; H01L 2224/73265; H01L 2224/48472; H01L 2224/48091;
  (Continued)

(56) References Cited

U.S. PATENT DOCUMENTS 3,289,452 A    12/1966 Koellner
3,358,897 A    12/1967 Christensen
(Continued)

FOREIGN PATENT DOCUMENTS

CN    1352804 A    6/2002
CN    1641832 A    7/2005
(Continued)

OTHER PUBLICATIONS

IBM et al., Method of Producing Thin-Film Wirings with Vias; IBM Technical Disclosure Bulletin, Apr. 1, 1989; International Business Machines Corp., (Thornwood), US—Issn 0018-8689; vol. 31, No. 11, pp. 209-210; https://priorart.ip.com.
(Continued)

*Primary Examiner* — Hrayr A Syadian

(57) ABSTRACT

Heat spreading substrate with embedded interconnects. In an embodiment in accordance with the present invention, an apparatus includes a metal parallelepiped comprising a plurality of wires inside the metal parallelepiped. The plurality of wires have a different grain structure than the metal parallelepiped. The plurality of wires are electrically isolated from the metal parallelepiped. The plurality of wires may be electrically isolated from one another.

11 Claims, 10 Drawing Sheets

(51) Int. Cl.
*H01L 23/00* (2006.01)
*H01L 21/52* (2006.01)
*H01L 21/768* (2006.01)
*H01L 23/495* (2006.01)

(52) U.S. Cl.
CPC .......... *H01L 21/768* (2013.01); *H01L 23/142* (2013.01); *H01L 23/49568* (2013.01); *H01L 24/97* (2013.01); *H01L 2224/16225* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48472* (2013.01); *H01L 2224/73265* (2013.01); *H01L 2924/01322* (2013.01); *H01L 2924/12041* (2013.01); *H01L 2924/19107* (2013.01)

(58) Field of Classification Search
CPC . H01L 2224/16225; H01L 2924/00014; H01L 2924/00
USPC .......................................................... 438/122
See application file for complete search history.

(56) References Cited

U.S. PATENT DOCUMENTS

| | | |
|---|---|---|
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |

(56) References Cited

U.S. PATENT DOCUMENTS

| | | |
|---|---|---|
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,373 B2 | 10/2002 | Funakura et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |

(56) References Cited

U.S. PATENT DOCUMENTS

| | | |
|---|---|---|
| 7,262,506 B2 | 8/2007 | Mess et al. |
| 7,268,421 B1 | 9/2007 | Lin |
| 7,276,799 B2 | 10/2007 | Lee et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,589,394 B2 | 9/2009 | Kawano |
| 7,592,638 B2 | 9/2009 | Kim |
| 7,605,479 B2 | 10/2009 | Mohammed |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,460 B2 | 3/2010 | Heitzer et al. |
| 7,683,482 B2 | 3/2010 | Nishida et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 | 9/2011 | Moriya |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |

(56) References Cited

U.S. PATENT DOCUMENTS

| | | |
|---|---|---|
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | Mckenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,502,387 B2 | 8/2013 | Choi et al. |
| 8,507,927 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,637,991 B2 | 1/2014 | Haba |
| 8,642,393 B1 | 2/2014 | Yu et al. |
| 8,646,508 B2 | 2/2014 | Kawada |
| 8,653,626 B2 | 2/2014 | Lo et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,680,662 B2 | 3/2014 | Haba et al. |
| 8,680,677 B2 | 3/2014 | Wyland |
| 8,680,684 B2 | 3/2014 | Haba et al. |
| 8,685,792 B2 | 4/2014 | Chow et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,846 B2 | 8/2014 | Lin et al. |
| 8,802,494 B2 | 8/2014 | Lee et al. |
| 8,811,055 B2 | 8/2014 | Yoon |
| 8,836,136 B2 | 9/2014 | Chau et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,963,339 B2 | 2/2015 | He et al. |
| 8,970,049 B2 | 3/2015 | Kamezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,136,254 B2 | 9/2015 | Zhao et al. |
| 9,142,586 B2 | 9/2015 | Wang et al. |
| 9,153,562 B2 | 10/2015 | Haba et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,452 B2 | 4/2016 | Chen et al. |
| 9,324,696 B2 | 4/2016 | Choi et al. |
| 9,349,706 B2 | 5/2016 | Co et al. |
| 9,362,161 B2 | 6/2016 | Chi et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |

(56) References Cited

U.S. PATENT DOCUMENTS

| | | | |
|---|---|---|---|
| 9,559,088 B2 | 1/2017 | Gonzalez et al. | |
| 2001/0017221 A1* | 8/2001 | Horiuchi | H01L 21/4885 174/260 |
| 2001/0042925 A1 | 11/2001 | Yamamoto et al. | |
| 2002/0014004 A1 | 2/2002 | Beaman et al. | |
| 2002/0125556 A1 | 9/2002 | Oh et al. | |
| 2002/0171152 A1 | 11/2002 | Miyazaki | |
| 2003/0006494 A1 | 1/2003 | Lee et al. | |
| 2003/0048108 A1 | 3/2003 | Beaman et al. | |
| 2003/0057544 A1 | 3/2003 | Nathan et al. | |
| 2003/0094666 A1 | 5/2003 | Clayton et al. | |
| 2003/0162378 A1 | 8/2003 | Mikami | |
| 2004/0041757 A1 | 3/2004 | Yang et al. | |
| 2004/0262728 A1 | 12/2004 | Sterrett et al. | |
| 2005/0017369 A1 | 1/2005 | Clayton et al. | |
| 2005/0062492 A1 | 3/2005 | Beaman et al. | |
| 2005/0082664 A1 | 4/2005 | Funaba et al. | |
| 2005/0095835 A1 | 5/2005 | Humpston et al. | |
| 2005/0156304 A1* | 7/2005 | Furuyama | H01L 23/49827 257/686 |
| 2005/0161814 A1 | 7/2005 | Mizukoshi et al. | |
| 2005/0173807 A1 | 8/2005 | Zhu et al. | |
| 2005/0176233 A1 | 8/2005 | Joshi et al. | |
| 2006/0087013 A1 | 4/2006 | Hsieh | |
| 2006/0255449 A1 | 11/2006 | Lee et al. | |
| 2007/0010086 A1 | 1/2007 | Hsieh | |
| 2007/0080360 A1 | 4/2007 | Mirsky et al. | |
| 2007/0190747 A1 | 8/2007 | Hup | |
| 2007/0254406 A1 | 11/2007 | Lee | |
| 2007/0271781 A9 | 11/2007 | Beaman et al. | |
| 2007/0290325 A1 | 12/2007 | Wu et al. | |
| 2008/0006942 A1 | 1/2008 | Park et al. | |
| 2008/0017968 A1 | 1/2008 | Choi et al. | |
| 2008/0023805 A1 | 1/2008 | Howard et al. | |
| 2008/0047741 A1 | 2/2008 | Beaman et al. | |
| 2008/0048690 A1 | 2/2008 | Beaman et al. | |
| 2008/0048691 A1 | 2/2008 | Beaman et al. | |
| 2008/0048697 A1 | 2/2008 | Beaman et al. | |
| 2008/0054434 A1 | 3/2008 | Kim | |
| 2008/0073769 A1 | 3/2008 | Wu et al. | |
| 2008/0100316 A1 | 5/2008 | Beaman et al. | |
| 2008/0100317 A1 | 5/2008 | Beaman et al. | |
| 2008/0100318 A1 | 5/2008 | Beaman et al. | |
| 2008/0100324 A1 | 5/2008 | Beaman et al. | |
| 2008/0105984 A1 | 5/2008 | Lee et al. | |
| 2008/0106281 A1 | 5/2008 | Beaman et al. | |
| 2008/0106282 A1 | 5/2008 | Beaman et al. | |
| 2008/0106283 A1 | 5/2008 | Beaman et al. | |
| 2008/0106284 A1 | 5/2008 | Beaman et al. | |
| 2008/0106285 A1 | 5/2008 | Beaman et al. | |
| 2008/0106291 A1 | 5/2008 | Beaman et al. | |
| 2008/0106872 A1 | 5/2008 | Beaman et al. | |
| 2008/0111568 A1 | 5/2008 | Beaman et al. | |
| 2008/0111569 A1 | 5/2008 | Beaman et al. | |
| 2008/0111570 A1 | 5/2008 | Beaman et al. | |
| 2008/0112144 A1 | 5/2008 | Beaman et al. | |
| 2008/0112145 A1 | 5/2008 | Beaman et al. | |
| 2008/0112146 A1 | 5/2008 | Beaman et al. | |
| 2008/0112147 A1 | 5/2008 | Beaman et al. | |
| 2008/0112148 A1 | 5/2008 | Beaman et al. | |
| 2008/0112149 A1 | 5/2008 | Beaman et al. | |
| 2008/0116912 A1 | 5/2008 | Beaman et al. | |
| 2008/0116913 A1 | 5/2008 | Beaman et al. | |
| 2008/0116914 A1 | 5/2008 | Beaman et al. | |
| 2008/0116915 A1 | 5/2008 | Beaman et al. | |
| 2008/0116916 A1 | 5/2008 | Beaman et al. | |
| 2008/0117611 A1 | 5/2008 | Beaman et al. | |
| 2008/0117612 A1 | 5/2008 | Beaman et al. | |
| 2008/0117613 A1 | 5/2008 | Beaman et al. | |
| 2008/0121879 A1 | 5/2008 | Beaman et al. | |
| 2008/0123310 A1 | 5/2008 | Beaman et al. | |
| 2008/0129319 A1 | 6/2008 | Beaman et al. | |
| 2008/0129320 A1 | 6/2008 | Beaman et al. | |
| 2008/0132094 A1 | 6/2008 | Beaman et al. | |
| 2008/0156518 A1 | 7/2008 | Honer et al. | |
| 2008/0164595 A1 | 7/2008 | Wu et al. | |
| 2008/0169548 A1 | 7/2008 | Baek | |
| 2008/0217708 A1 | 9/2008 | Reisner et al. | |
| 2008/0280393 A1 | 11/2008 | Lee et al. | |
| 2008/0284045 A1 | 11/2008 | Gerber et al. | |
| 2008/0303153 A1 | 12/2008 | Oi et al. | |
| 2008/0308305 A1 | 12/2008 | Kawabe | |
| 2009/0008796 A1 | 1/2009 | Eng et al. | |
| 2009/0014876 A1 | 1/2009 | Youn et al. | |
| 2009/0032913 A1 | 2/2009 | Haba | |
| 2009/0085185 A1 | 4/2009 | Byun et al. | |
| 2009/0091009 A1 | 4/2009 | Corisis et al. | |
| 2009/0102063 A1 | 4/2009 | Lee et al. | |
| 2009/0127686 A1 | 5/2009 | Yang et al. | |
| 2009/0128176 A1 | 5/2009 | Beaman et al. | |
| 2009/0140415 A1 | 6/2009 | Furuta | |
| 2009/0166664 A1 | 7/2009 | Park et al. | |
| 2009/0189288 A1 | 7/2009 | Beaman et al. | |
| 2009/0256229 A1 | 10/2009 | Ishikawa et al. | |
| 2009/0315579 A1 | 12/2009 | Beaman et al. | |
| 2010/0044860 A1 | 2/2010 | Haba et al. | |
| 2010/0078795 A1 | 4/2010 | Dekker et al. | |
| 2010/0193937 A1 | 8/2010 | Nagamatsu et al. | |
| 2010/0200981 A1 | 8/2010 | Huang et al. | |
| 2010/0258955 A1 | 10/2010 | Miyagawa et al. | |
| 2010/0289142 A1 | 11/2010 | Shim et al. | |
| 2010/0314748 A1 | 12/2010 | Hsu et al. | |
| 2010/0327419 A1 | 12/2010 | Muthukumar et al. | |
| 2011/0042699 A1 | 2/2011 | Park et al. | |
| 2011/0068478 A1 | 3/2011 | Pagaila et al. | |
| 2011/0157834 A1* | 6/2011 | Wang | H01L 23/142 361/717 |
| 2012/0043655 A1 | 2/2012 | Khor et al. | |
| 2012/0063090 A1 | 3/2012 | Hsiao et al. | |
| 2012/0080787 A1 | 4/2012 | Shah et al. | |
| 2012/0086111 A1 | 4/2012 | Iwamoto et al. | |
| 2012/0126431 A1 | 5/2012 | Kim | |
| 2012/0153444 A1 | 6/2012 | Haga et al. | |
| 2012/0184116 A1 | 7/2012 | Pawlikowski et al. | |
| 2013/0001797 A1 | 1/2013 | Choi et al. | |
| 2013/0049218 A1 | 2/2013 | Gong et al. | |
| 2013/0087915 A1 | 4/2013 | Warren et al. | |
| 2013/0153646 A1 | 6/2013 | Ho | |
| 2013/0200524 A1 | 8/2013 | Han et al. | |
| 2013/0234317 A1 | 9/2013 | Chen et al. | |
| 2013/0256847 A1 | 10/2013 | Park et al. | |
| 2013/0323409 A1 | 12/2013 | Read et al. | |
| 2013/0328178 A1 | 12/2013 | Bakalski et al. | |
| 2014/0035892 A1 | 2/2014 | Shenoy et al. | |
| 2014/0103527 A1 | 4/2014 | Marimuthu et al. | |
| 2014/0124949 A1 | 5/2014 | Paek et al. | |
| 2014/0175657 A1 | 6/2014 | Oka et al. | |
| 2014/0225248 A1 | 8/2014 | Henderson et al. | |
| 2014/0239479 A1 | 8/2014 | Start | |
| 2014/0239490 A1 | 8/2014 | Wang | |
| 2014/0308907 A1 | 10/2014 | Chen | |
| 2014/0312503 A1 | 10/2014 | Seo | |
| 2015/0044823 A1 | 2/2015 | Mohammed | |
| 2015/0076714 A1 | 3/2015 | Haba et al. | |
| 2015/0130054 A1 | 5/2015 | Lee et al. | |
| 2015/0206865 A1 | 7/2015 | Yu et al. | |
| 2015/0340305 A1 | 11/2015 | Lo | |
| 2015/0380376 A1 | 12/2015 | Mathew et al. | |
| 2016/0043813 A1 | 2/2016 | Chen et al. | |
| 2016/0172268 A1 | 6/2016 | Katkar et al. | |
| 2016/0200566 A1 | 7/2016 | Ofner et al. | |
| 2016/0225692 A1 | 8/2016 | Kim et al. | |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |

(56) References Cited

FOREIGN PATENT DOCUMENTS

| | | |
|---|---|---|
| JP | 551-050661 | 5/1976 |
| JP | 59189069 A | 10/1984 |
| JP | 31125062 A | 6/1986 |
| JP | 562158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 | 6/2003 |
| JP | 2003307897 A | 10/2003 |
| JP | 2004031754 A | 1/2004 |
| JP | 2004047702 A | 2/2004 |
| JP | 2004-172157 A | 6/2004 |
| JP | 2004-200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005142378 A | 6/2005 |
| JP | 2005175019 A | 6/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 A | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 A | 2/2009 |
| JP | 2009508324 A | 2/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| KR | 100265563 A1 | 9/2000 |
| KR | 20010061849 A | 7/2001 |
| KR | 2001-0094894 A | 11/2001 |
| KR | 20020058216 A | 7/2002 |
| KR | 20060064291 A | 6/2006 |
| KR | 10-2007-0058680 A | 6/2007 |
| KR | 20080020069 | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Preliminary Report on Patentability for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010, 28 pages.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, (ISR Appln. No. PCT/US2012/060402, dated Feb. 21, 2013 provides concise stmt. Of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.

(56) References Cited

OTHER PUBLICATIONS

North Corporation, Processed intra-Layer Interconnection Material for PWBs [Etched Copper Bump with Copper Foil], NMBITM, Version 2001.6.

NTK HTCC Package General Design Guide, Communication Media Components Group, NGK Spark Plug Co., Ltd., Komaki, Aichi, Japan, Apr. 2010, 32 pages.

Partial International Search Report from Invitation to Pay Additional Fees for Appln. No. PCT/US20121028738, dated Jun. 6, 2012.

Partial International Search Report for Appln. No. PCT/US2012/060402, dated Feb. 21, 2011.

Partial International Search Report for Appln. No. PCT/US2013/026126, dated Jun. 17, 2013.

Partial International Search Report for Appln. No. PCT/US2013/075672, dated Mar. 12, 2014.

Partial International Search Report for Appln. No. PCT/US2014/014181, dated May 8, 2014.

Partial International Search Report for Appln. No. PCT/US2015/033004, dated Sep. 9, 2015.

Redistributed Chip Package (RCP) Technology, Freescale Semiconductor, 2005, 6 pages.

Taiwan Office Action for 102106326, dated Dec. 13, 2013.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
U.S. Appl. No. 13/477,532, dated May 22, 2012.
U.S. Office Action for U.S. Appl. No. 12/769,930, dated May 5, 2011.

3D Plus "Wafer Level Stack—WDoD", [online] [Retrieved Aug. 5, 2010] Retrieved from internet: <http://www.3d-plus.com/techno-wafer-level-stack-wdod.php>, 2 pages.

Written Opinion for Appln. No. PCT/US2014/050125, dated Jul. 15, 2015.

Yoon, PhD, Seung Wook, "Next Generation Wafer Level Packaging Solution for 3D Integration," May 2010, STATS ChipPAC Ltd.

Bang, U.S. Appl. No. 10/656,534, filed Sep. 5, 2003.

Brochure, "High Performance BVA PoP Package for Mobile Systems," Invensas Corporation, May 2013, 20 pages.

Brochure, "Invensas BVA PoP for Mobile Computing: Ultra High IO Without TSVs," Invensas Corporation, Jun. 26, 2012, 4 pages.

Brochure, "Invensas BVA PoP for Mobile Computing: 100+ GB/s BVA PoP," Invensas Corporation, c. 2012, 2 pages.

Campos et al., "System in Package Solutions Using Fan-Out Wafer Level Packaging Technology," SEMI Networking Day, Jun. 27, 2013, 31 pages.

Chinese Office Action for Application No. 201180022247.8 dated Sep. 16, 2014.

Chinese Office Action for Application No. 201180022247.8 dated Apr. 14, 2015.

Chinese Office Action for Application No. 201310264264.3 dated May 12, 2015.

EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.

Extended European Search Report for Appln. No. EP13162975, dated Sep. 5, 2013.

IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.

International Search Report for Appln. No. PCT/US2005/039716, dated Apr. 5, 2006.

International Search Report and Written Opinion for Appln. No. PCT/US2011/024143, dated Sep. 14, 2011.

Partial Search Report—Invitation to Pay Fees for Appln. No. PCT/US2011/024143, dated Jan. 17, 2012.

International Search Report and Written Opinion for Appln. No. PCT/US2011/060551, dated Apr. 18, 2012.

International Search Report and Written Opinion for Appln. No. PCT/US2011/044342, dated May 7, 2012.

International Search Report and Written Opinion for Appln. No. PCT/US2011/044346, dated May 11, 2012.

International Search Report and Written Opinion for Appln. No. PCT/US2012/060402, dated Apr. 2, 2013.

International Search Report and Written Opinion for Appln. No. PCT/US2013/026126, dated Jul. 25, 2013.

International Search Report and Written Opinion for Appln. No. PCT/US2013/052883, dated Oct. 21, 2013.

* cited by examiner

HEAT SPREADING SUBSTRATE WITH EMBEDDED INTERCONNECTS

CROSS-REFERENCE TO RELATED APPLICATIONS

This application is a divisional of U.S. patent application Ser. No. 13/399,941, filed Feb. 27, 2012, the disclosure of which is incorporated herein by reference.

FIELD OF INVENTION

Embodiments of the present invention relate to the field of integrated circuit design and manufacture. More specifically, embodiments of the present invention relate to systems and methods for a heat spreading substrate with embedded interconnects.

BACKGROUND

A variety of semiconductor devices, for example, light emitting diodes (LED), radio frequency (RF) devices, motor controllers, power semiconductors and the like, may be characterized as having high power density. For example, many LED devices may be said to run "hot." In addition, the substrates of many such devices, e.g., comprising sapphire or Gallium arsenide (GaAs), are not good conductors of heat. Conventional mounting and heat sinking methods and structures do not cost effectively remove the heat generated by such devices.

SUMMARY OF THE INVENTION

Therefore, what is needed are systems and methods for heat spreading substrate with embedded interconnects. What is additionally needed are systems and methods for heat spreading substrate with embedded interconnects that are simple and cost effective to manufacture. A further need exists for systems and methods for heat spreading substrate with embedded interconnects that are compatible and complementary with existing systems and methods of integrated circuit design, manufacturing and test. Embodiments of the present invention provide these advantages.

In a first embodiment in accordance with the present invention, an apparatus includes a metal parallelepiped comprising a plurality of wires inside the metal parallelepiped. The plurality of wires have a different grain structure than the metal parallelepiped. The plurality of wires are electrically isolated from the metal parallelepiped. The plurality of wires may be electrically isolated from one another.

In accordance with a method embodiment of the present invention, a plurality of wires are bonded to a substrate. A volume is filled with an electrically and thermally conductive material. The volume is in contact with the substrate and includes the plurality of wires. The electrically and thermally conductive material has a different grain structure from that of the plurality of wires. The plurality of wires may (or may not) be coated with a dielectric prior to or after the bonding.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1A:
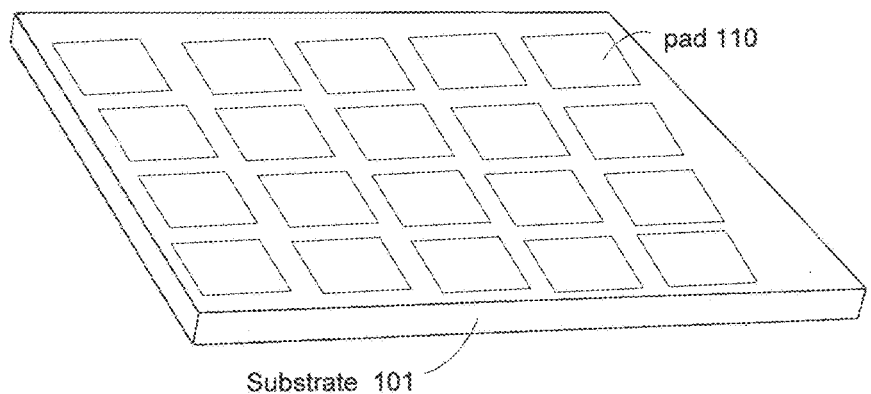
FIGS. 1A, 1B, 1C, 1D, 1E, 1F, 1G, 1H and 1I illustrate multiple methods of manufacture of a heat spreading substrate with embedded interconnects, in accordance with embodiments of the present invention.

Reference will now be made in detail to various embodiments of the invention, front facing piggyback wafer assembly, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating"

or "processing" or "forming" or "roughening" or "filling" or "accessing" or "performing" or "generating" or "adjusting" or "creating" or "executing" or "continuing" or "indexing" or "processing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

FIGS. 1A-1I illustrate multiple methods of manufacture of a heat spreading substrate with embedded interconnects 100, in accordance with embodiments of the present invention. FIG. 1A illustrates a substrate 101 comprising a plurality of wire bond pads 110, in accordance with embodiments of the present invention. Substrate 101 should be characterized as having a high thermal conductivity, e.g., having a thermal conductivity greater than that of sapphire ($\alpha$-$Al_2O_3$), 32 or 35 W $\cdot m^{-1} \cdot K^{-1}$, depending on the orientation. Substrate 101 may comprise any suitable material, e.g., metal and/or a metal film, including Copper (Cu), Aluminum (Al), metal powders, particle filled materials, Silicon, metal-filled epoxy, composite materials and the like. Substrate 101 may comprise multiple layers and may further comprise routing traces, in accordance with embodiments of the present invention.

Figure 1B:
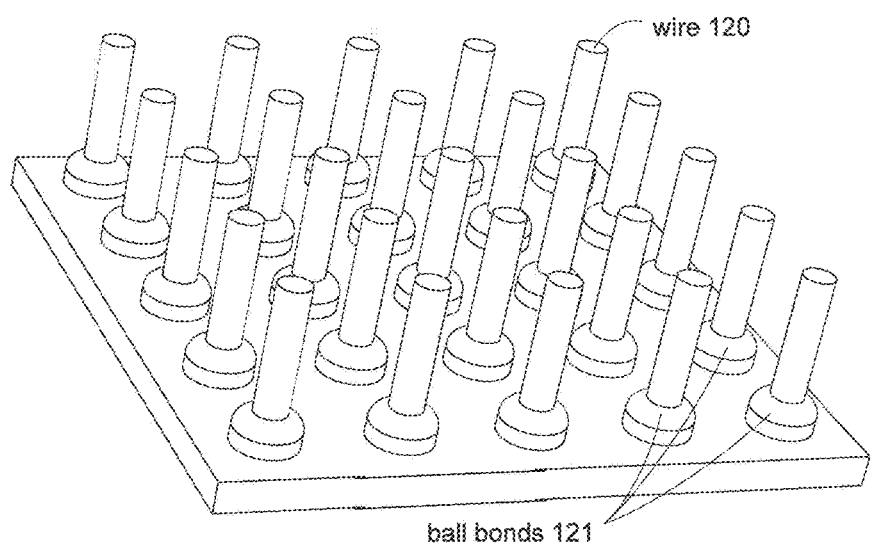

FIG. 1B illustrates the addition of a plurality of bond wires 120 applied to substrate 101, in accordance with embodiments of the present invention. Bond wires 120 may be applied via conventional wire-bonding techniques. Bond wires 120 may comprise Copper (Cu), Gold (Au), alloyed-Aluminum or any other suitable material. In accordance with embodiments of the present invention, the ball bonds 121 may touch one another. If the ball bonds 121 are in electrical contact, the ball bonds 121 may be optionally removed, as further described with respect to FIG. 1F, below.

The bond wires 120 may be substantially vertical, e.g., perpendicular to the substrate 101, or they may be formed and/or placed at an angle of up to about 30 degrees from the vertical, for example, as may occur with loop or stitch bonding.

Figure 1C:
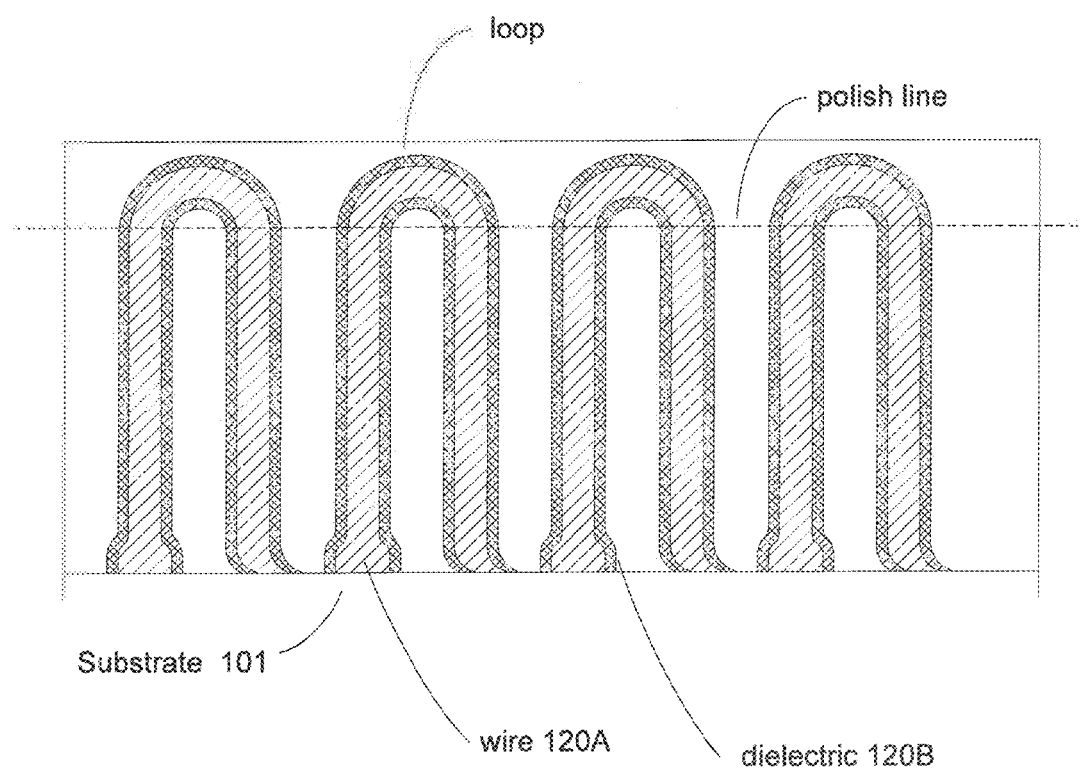

FIG. 1C illustrates the addition of a plurality of bond wires 120 applied to substrate 101, in accordance with embodiments of the present invention. In FIG. 1C, bond wires 120 are applied via loop or stitch bonding.

Figure 1D:
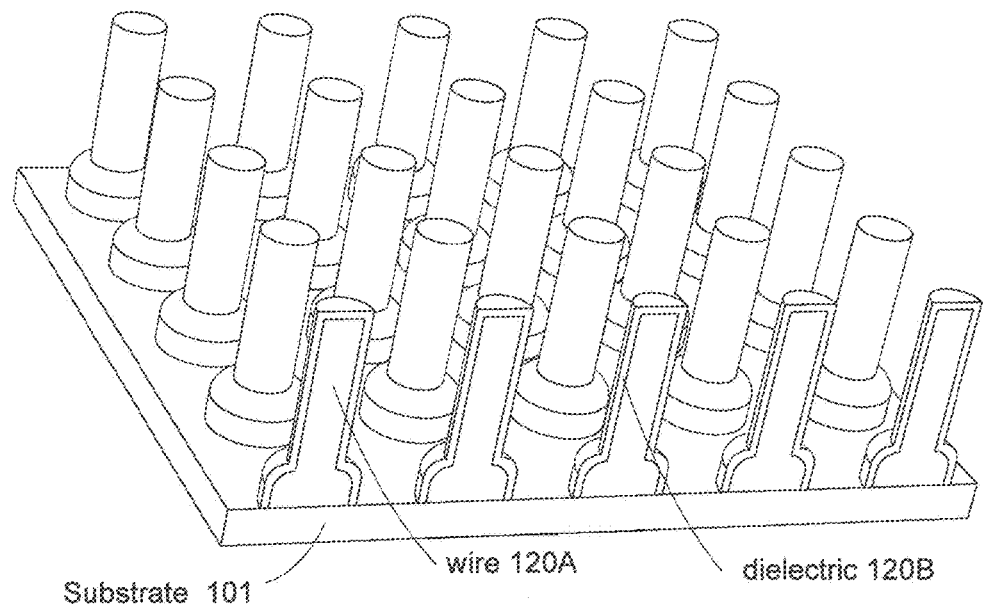

In accordance with embodiments of the present invention, wires 120 may comprise conductive wires 120A coated with a dielectric 120B, e.g., an electrophoretically deposited polymer or Silicon nitride. Alternatively, "bare" wires 120A may be coated with a dielectric 120B after wire bonding. FIG. 1D illustrates bonded conductors 120A coated with a dielectric 120B, in accordance with embodiments of the present invention.

Figure 1E:
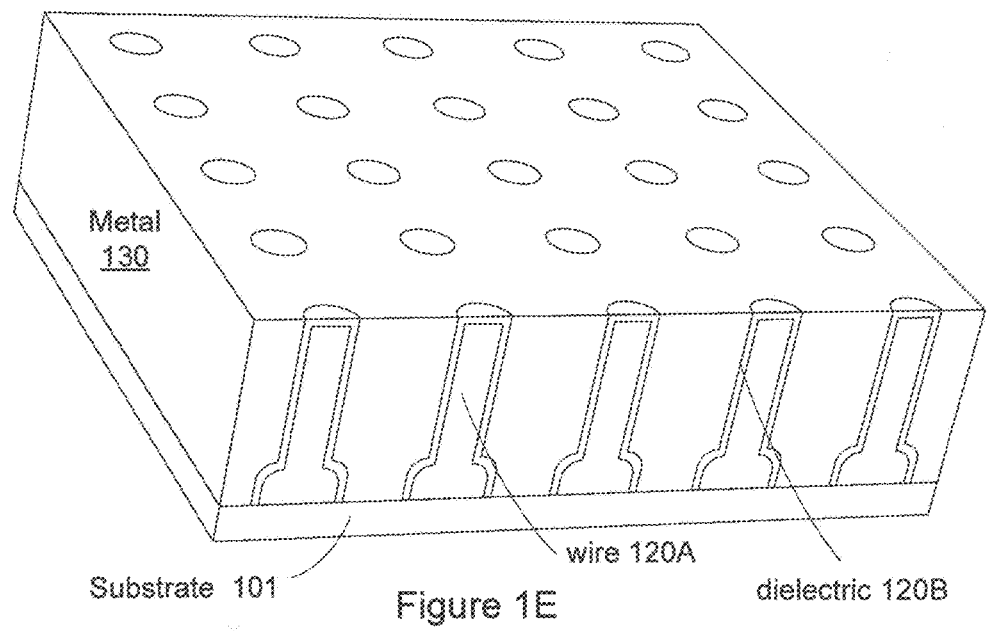

FIG. 1E illustrates metal 130 electroplated over substrate 101 and encompassing wires 120 and ball bonds 121, in accordance with embodiments of the present invention. In an alternative embodiment in accordance with the present invention, the volume of metal 130 may be filled by any suitable process utilizing any suitable material, e.g., a fill metal, electrically conductive epoxy, powdered metal and/or a metal-filled material.

Metal 130 generally forms a regular solid, e.g., a cuboid or parallelepiped. It is to be appreciated, however, that metal 130 is not completely solid, as it comprises gaps formed by the wires 120. It is to be further appreciated that metal 130, whether electroplated as illustrated in the embodiments of FIG. 1E, or formed via other methods, as described below, will have a different grain structure from the bond wires 120A, which are typically drawn wires.

Figure 1F:
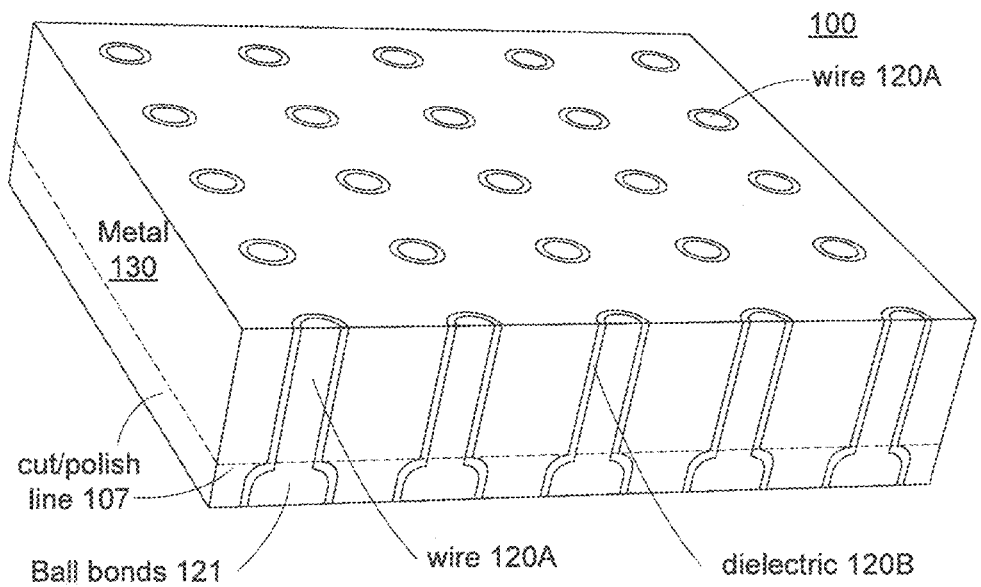

FIG. 1F illustrates a first embodiment of a heat spreading substrate with embedded interconnects 100, in accordance with embodiments of the present invention. In FIG. 1F, the substrate 101 is optionally removed, in accordance with embodiments of the present invention. In addition, the top surface is optionally polished, exposing the conductive portion of the wire bond, 120A, exposed on both the top and bottom surfaces of metal 130. For example, if the wires 120A comprise loop bonding, top surface polishing may eliminate the loop in the wire, electrically isolating the remaining wires.

FIG. 1F also illustrates optional cut/polish extent line 107. In accordance with embodiments of the present invention, substrate 101 and/or metal 130 may be cut and/or polished to cut/polish line 107 to remove ball bonds 121. In this novel manner, the wires 120 may be placed closer together, e.g., without a need to physically separate ball bonds 121 from one another, and heat spreading substrate with embedded interconnects 100 may achieve a denser interconnect structure with a finer pitch, in comparison to a technique requiring wires and balls to be electrically isolated. It is to be appreciated that cut/polish line 107 is well suited to all embodiments in accordance with the present invention.

Figure 1G:
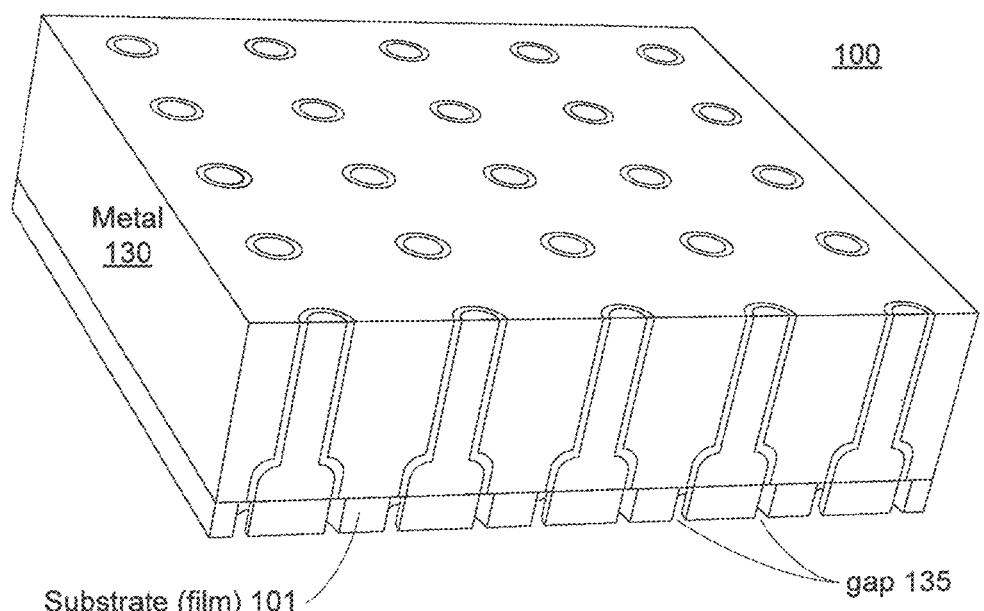

FIG. 1G illustrates a second embodiment of a heat spreading substrate with embedded interconnects 100, in accordance with embodiments of the present invention. In FIG. 1G, a substrate 101 comprising a metal film is optionally patterned to electrically isolate the wire bond pads 110, wires 120A and/or the ball bonds 121 from the metal 130. For example, a gap 135 is formed in film substrate 101.

Figure 1H:
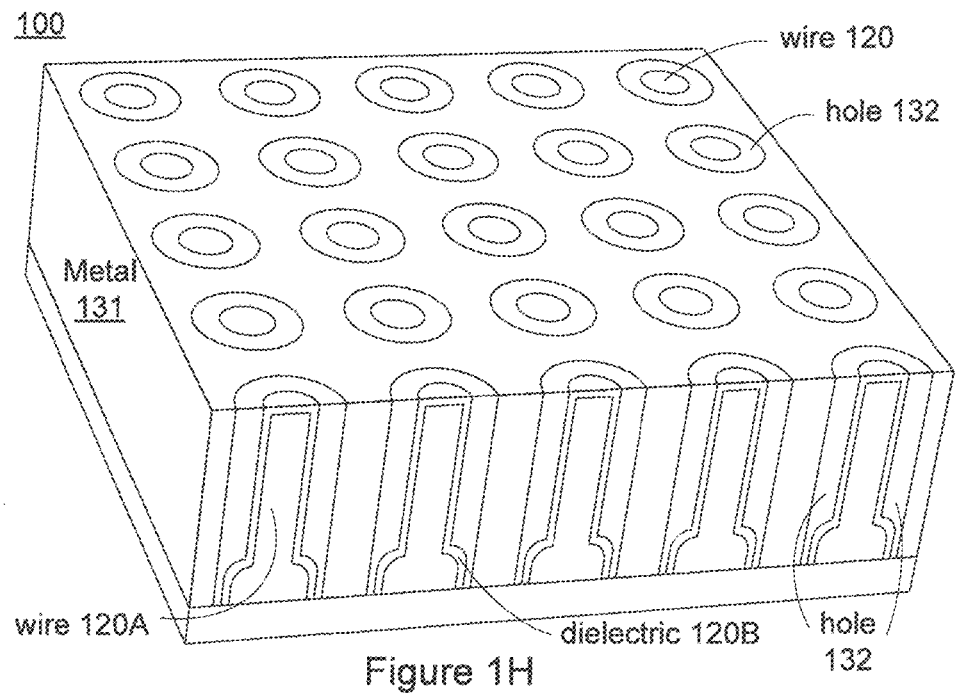

FIG. 1H illustrates a third embodiment of a heat spreading substrate with embedded interconnects 100, in accordance with embodiments of the present invention. FIG. 1H illustrates an alternative method of manufacture of heat spreading substrate with embedded interconnects 100, in accordance with embodiments of the present invention. Starting with the configuration of FIG. 1D, metal 131 is laminated to the substrate or film 101. Metal 131 comprises holes 132 that have been pre-drilled, perforated or otherwise formed. Holes 132 fit over wires 120 and ball bonds 121. After lamination of metal 131 to substrate 101, the remaining volume of the holes 132 may be filled in, e.g., plated.

Figure 1I:
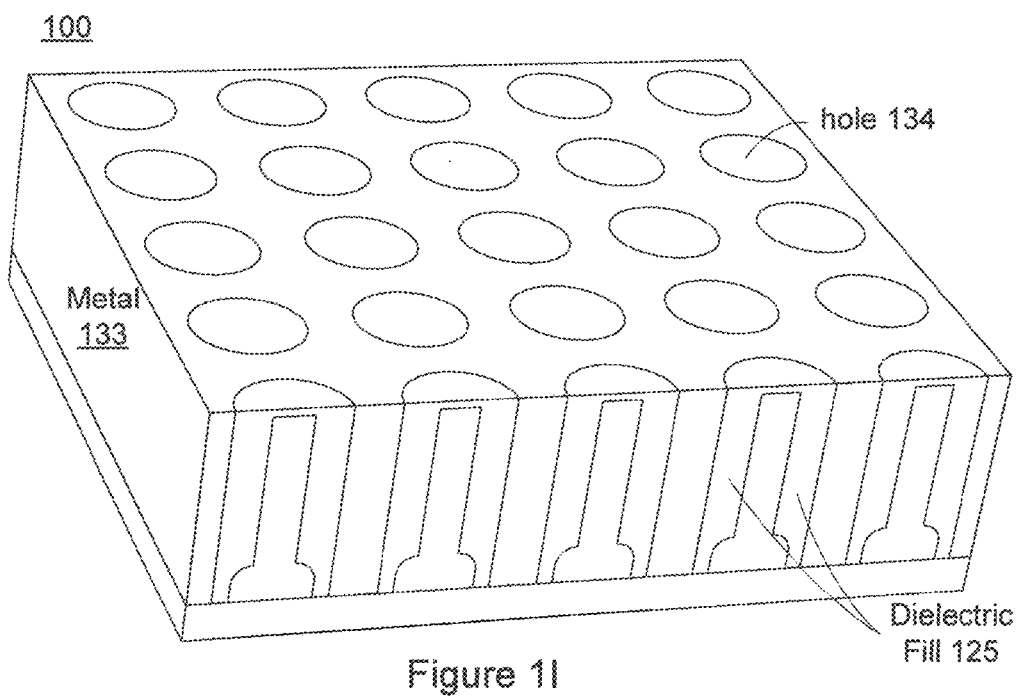

FIG. 1I illustrates a fourth embodiment of a heat spreading substrate with embedded interconnects 100, in accordance with embodiments of the present invention. FIG. 1I illustrates an alternative method of manufacture of heat spreading substrate with embedded interconnects 100, in accordance with embodiments of the present invention. Starting with the configuration of FIG. 1D, metal 133 is laminated to the substrate or film 101. Metal 133 comprises holes 134 that have been pre-drilled or otherwise formed. Holes 134 fit over wires 120A and ball bonds 121. It is to be appreciated that wires 120A may not be coated with dielectric. After lamination of metal 133 to substrate 101, the remaining volume of the holes 134 may be filled with dielectric 125.

Figure 2:
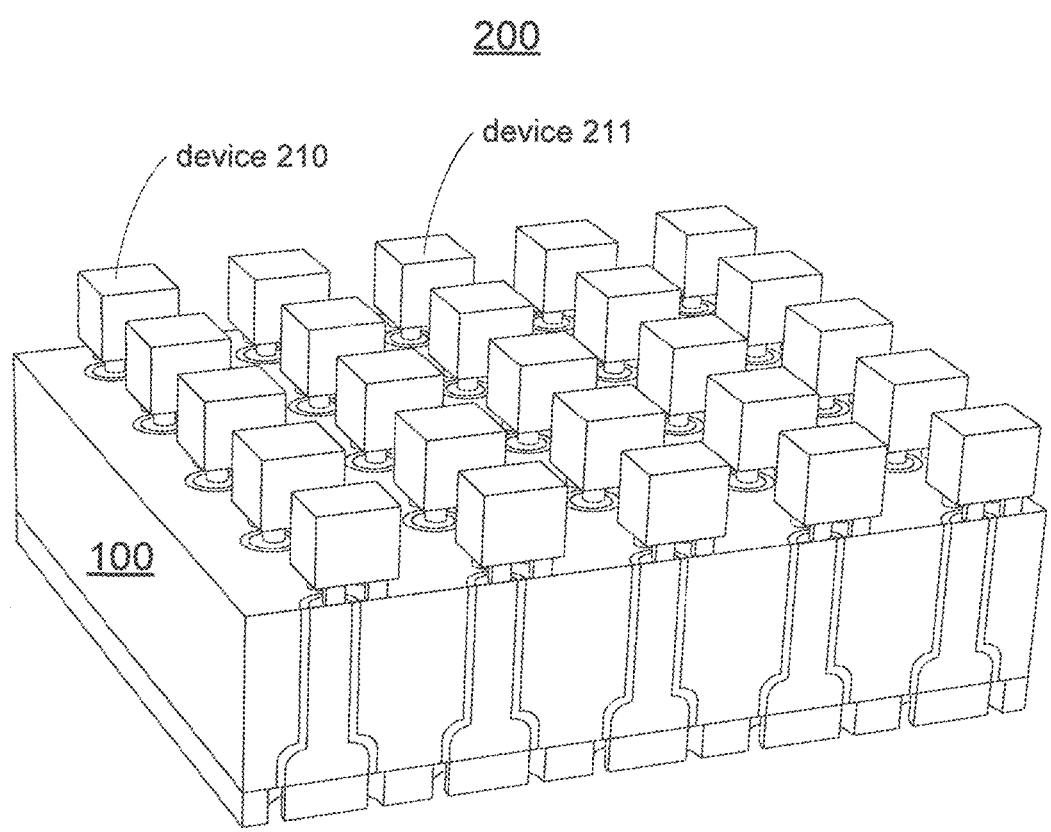
FIG. 2 illustrates an application of heat spreading substrate with embedded interconnects, in accordance with embodiments of the present invention.

FIG. 2 illustrates an application of heat spreading substrate with embedded interconnects 100, in accordance with embodiments of the present invention. In FIG. 2, a plurality of electronic devices 210, 211 have been functionally mounted to heat spreading substrate with embedded interconnects 100 to form electronic assembly 200. Embodiments in accordance with the present invention are well suited to a variety of electronic devices, including, for example, light emitting diodes (LED), radio frequency (RF) devices, motor controllers, power semiconductors and the like.

The plurality of electronic devices 210, 211 need not be of the same design, in accordance with embodiments of the present invention. For example, electronic device 210 may be an LED, whereas electronic device 211 may comprise power and control electronics for LED 210.

Figure 3:
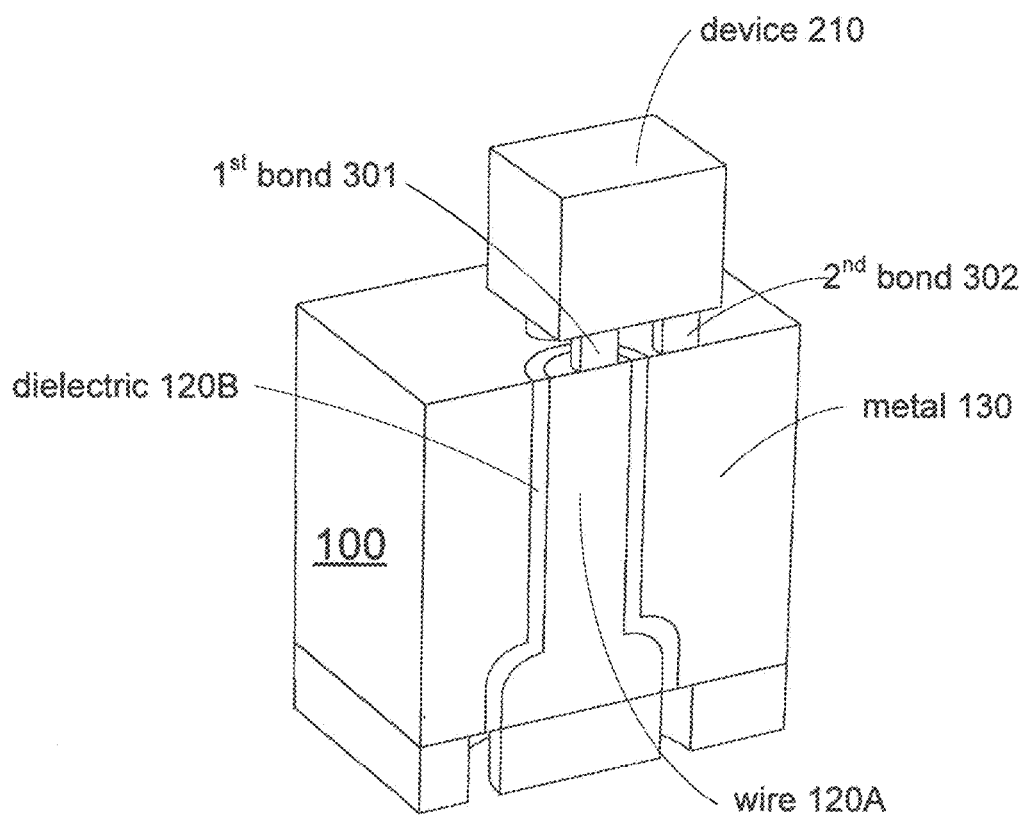
FIG. 3 illustrates a detail of electronic assembly, in accordance with embodiments of the present invention.

FIG. 3 illustrates a detail of electronic assembly 200, in accordance with embodiments of the present invention. In FIG. 3, a first device contact (on the bottom of device 210, not shown) is electrically coupled to the wire 120A via first bond 301, and a second device contact (not shown) is electrically coupled to the conductive body of heat spreading substrate with embedded interconnects 100, e.g., metal 130, 131 or 133, via second bond 302. Bonds 301 and 302 may comprise a variety of bonding types, including, for example, solder balls, controlled chip collapse connections (C4), conductive epoxy and/or eutectic solder. It is to be appreciated that dielectric 120B electrically isolates first lead 301 and wire 120A from second lead 302 and the metal body, e.g., metal 130. Device 210 may be surface mounted to heat spreading substrate with embedded interconnects 100. Alternatively, device 210 may comprise short leads, and such leads may be mounted to heat spreading substrate with embedded interconnects 100.

In accordance with embodiments of the present invention, a plurality of electronic devices, e.g., 210, 211 (FIG. 2) may be surface mounted to a heat spreading substrate with embedded interconnects 100. It is to be appreciated that dielectric 120B may form a solder mask to prevent wicking of solder across contacts of the heat spreading substrate with embedded interconnects 100.

Figure 4:
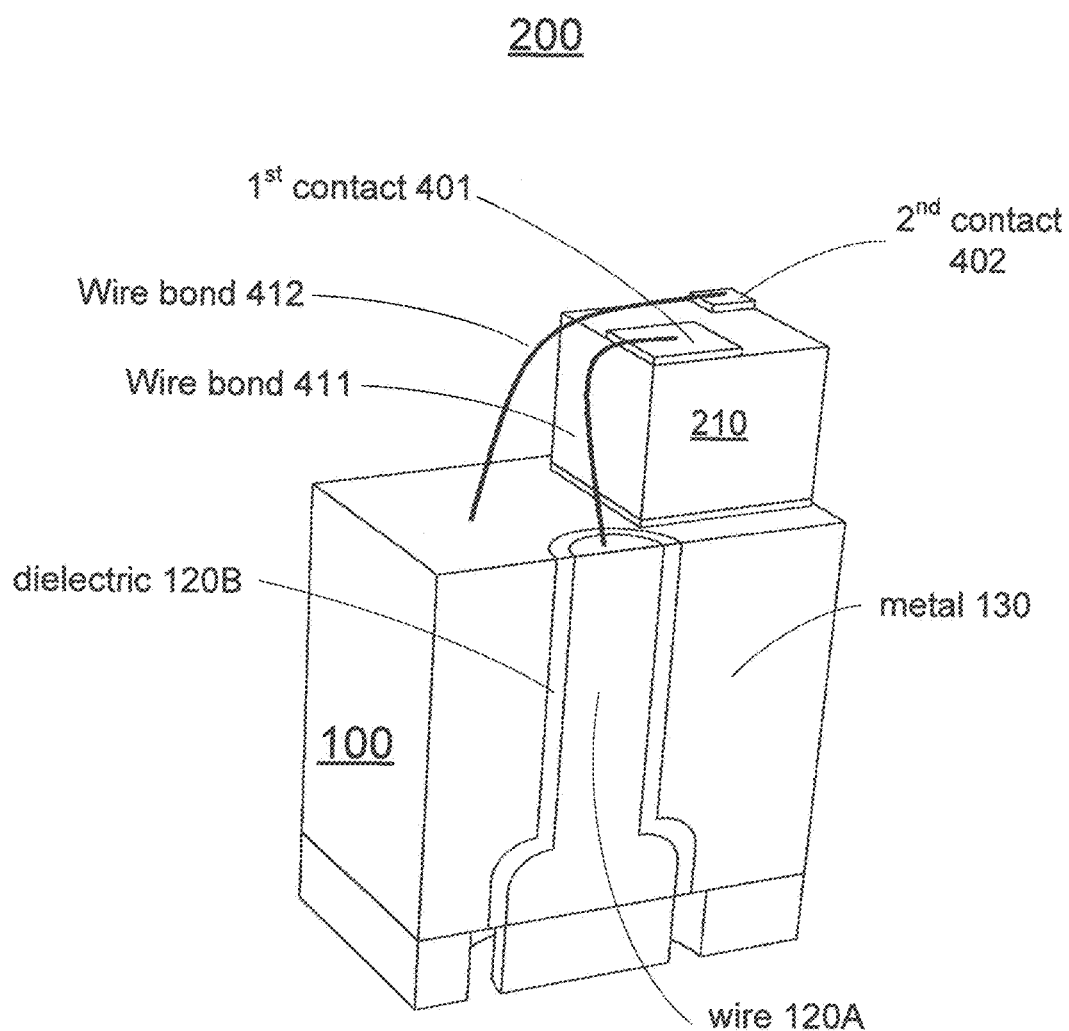
FIG. 4 illustrates a detail of electronic assembly, in accordance with embodiments of the present invention.

FIG. 4 illustrates a detail of electronic assembly 200, in accordance with embodiments of the present invention. In FIG. 4, a first contact 401 is electrically coupled to the end or face of wire 120A via wire bond 411, and a second lead 302 is electrically coupled to the conductive body of heat spreading substrate with embedded interconnects 100, e.g., metal 130, 131 or 133, via wire bond 412. It is to be appreciated that dielectric 120B electrically isolates first contact 401 and wire 120A from second contact 402 and the metal body, e.g., metal 130.

In accordance with embodiments of the present invention, the plurality of electronic devices mounted on heat spreading substrate with embedded interconnects 100 may be individualized or singulated. For example, heat spreading substrate with embedded interconnects 100 may be sawed or otherwise cut between electronic devices.

In accordance with alternative embodiments of the present invention, some contacts of an electronic device may be functionally coupled to heat spreading substrate with embedded interconnects 100 via surface mount methods, while other contacts of the same electronic device may be functionally coupled to heat spreading substrate with embedded interconnects 100 via wire bond techniques. For example, a contact on the bottom of electronic device 210 may be functionally coupled to heat spreading substrate with embedded interconnects 100 via a surface mount connection, while a contact on the top of electronic device 210 may be functionally coupled to heat spreading substrate with embedded interconnects 100 via a wire bond connection. It is to be appreciated that light emitting diodes frequently have electrical terminals at opposite ends of their layer stack. Embodiments in accordance with the present invention are well suited to such applications.

Alternatively, a plurality of electronic devices, e.g., an array or matrix, of similar and/or dissimilar electronic devices may be operated while mounted together on a common instance of heat spreading substrate with embedded interconnects 100. For example, if many of the plurality of electronic devices are light emitting diodes (LED), the assembly may provide more light than a single LED is capable of providing. Alternatively, the array/matrix of LEDs may provide a variety of spectral colors, by combining the light output of multiple, single-color, LEDs.

In accordance with embodiments of the present invention, a plurality of electronic devices may be assembled onto a heat spreading substrate with embedded interconnects 100, as illustrated in FIG. 2. These assemblies are commonly referred to in terms of the electronic device. For example, the combination of one or more light emitting diodes, e.g., 210, 211 (FIG. 2) assembled onto a heat spreading substrate may be referred to itself as a light emitting diode (LED). Similarly, an individual LED mounted on heat spreading substrate with embedded interconnects 100, may also be referred to as an LED.

In this novel manner, heat generated from electronic devices 210, 211 (FIG. 2) is efficiently and cost effectively conducted through the metal 130, 131 or 133 and to any additional heat sinking structures. For example, heat flows "down" in the perspective of FIG. 2. In addition, heat spreading substrate with embedded interconnects 100 may also conduct electrical signals, e.g., voltage and ground, to electronic devices 210, 211.

Figure 5:
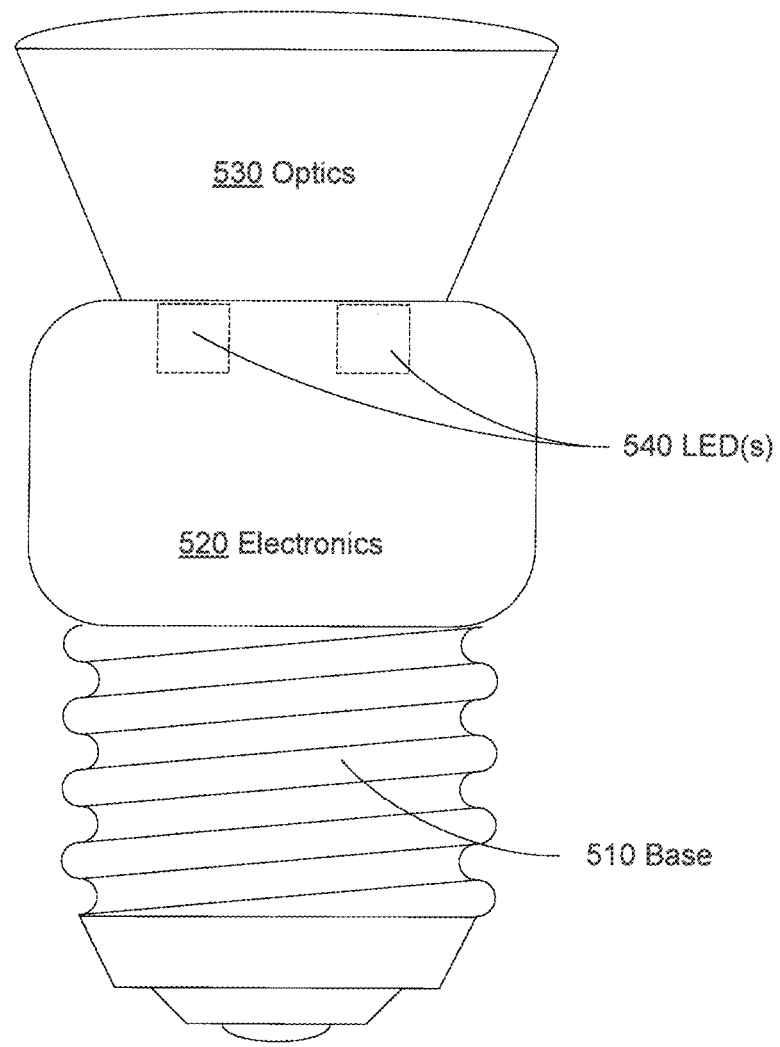
FIG. 5 illustrates an example of an application of a light emitting diode, in accordance with embodiments of the present invention.

FIG. 5 illustrates an example of an application of a light emitting diode, in accordance with embodiments of the present invention. Light source 500 is well suited to a variety of lighting applications, including domestic, industrial and landscape lighting. Light source 500 is also well suited to stage or theatrical lighting. Light source 500 comprises a base 510. As illustrated, base 510 is an Edison type base. It is appreciated that embodiments in accordance with the present invention are well suited to other types of bases, including, for example, GU, bayonet, bipin, wedge, stage pin or other types of bases.

Light source 500 additionally comprises a body portion 520 that houses power conditioning electronics (not shown) that convert 110V AC input electrical power (or 220 V AC, or other selected input electrical power) to electrical power suitable for driving a plurality of light emitting diode devices 540. Body portion 520 may also comprise, or couple to, optional heat sink features (not shown).

Light source 500 additionally comprises optional optics 530. Optics 530 comprise diffusers and/or lenses for focusing and/or diffusing light from the plurality of light emitting diode devices 540 into a desired pattern.

Light source 500 comprises a plurality of light emitting diode devices (LEDs) 540. Individual LEDs of plurality of light emitting diode devices 540 may correspond to assemblies previously described herein. For example, plurality of light emitting diode devices 540 may include instances of devices 210, 211 (FIG. 2). It is appreciated that not all instances of plurality of light emitting diode devices 540 need be identical.

It is to be further appreciated that plurality of light emitting diode devices 540 may include a single heat spreading substrate comprising multiple light emitting devices. For example, a single instance of plurality of light emitting diode devices 540 may comprise a plurality of individual, different, LED devices mounted on a common heat spreading substrate. For example, one instance of an electronic device may be a blue light emitting diode comprising a sapphire substrate. Another instance of an electronic device may be a green light emitting diode comprising a Gallium phosphide (GaP) substrate. Another instance of an electronic device may be a red light emitting diode comprising a Gallium arsenide (GaAs) substrate. The three instances of electronic devices may be arranged in an array on heat spreading substrate with embedded interconnects 100 such that the light from such three colors may be combined to produce a variety of spectral colors. For example, a plurality of light emitting diode devices may operate in combination to produce a "white" light output.

In accordance with embodiments of the present invention, plurality of light emitting diode devices 540 may include additional electronics associated with the LED devices, e.g., as previously described with respect to FIG. 2. In one exemplary embodiment, such additional electronics may comprise circuits to implement a white balance among tri-color LEDs.

Figure 6:
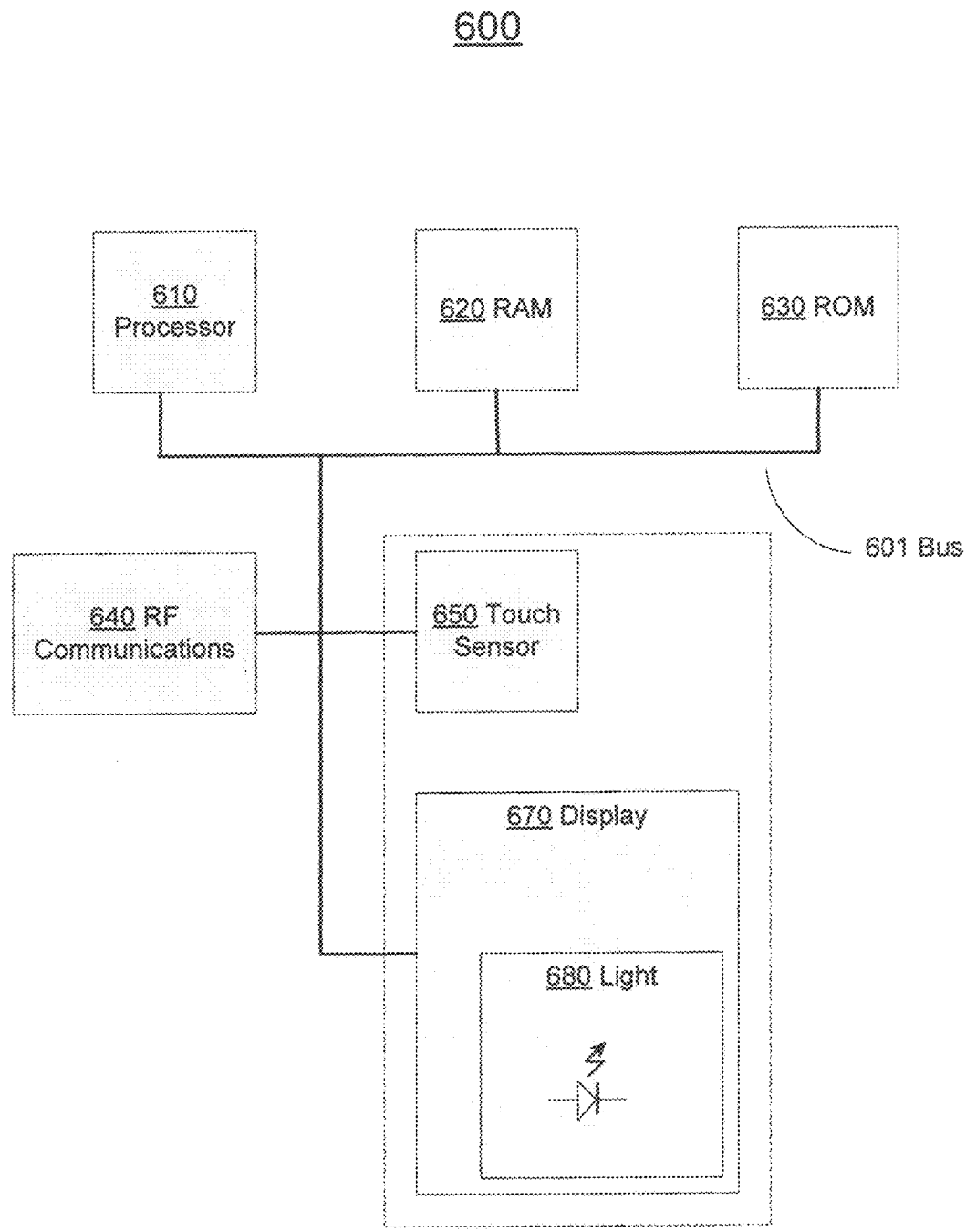
FIG. 6 illustrates an exemplary portable computer system 600, in accordance with embodiments of the present invention.

FIG. 6 illustrates an exemplary portable computer system 600, in accordance with embodiments of the present invention. Portable computer system 600 may be a mobile phone or smart phone, email device, tablet, laptop or netbook computer, personal digital assistant or the like. A bus 601 functionally couples the various functional blocks of system 600. Bus 601 may comprise multiple busses, and any such bus may be a single conductor.

Portable computer system 600 comprises a processor 610. Processor 610 may be any type of processor for executing software, and may comprise multiple distinct processors, including central processing units and graphical processing units. Processor 610 may also be a multi-core device. Processor 610 generally controls the operation of portable computer system 600, and may operate a graphical user interface. For example, processor 610 accepts input, e.g., from touch sensor 650 and/or optional RF communications 640, and may produce output, e.g., to display 670 and/or RF communications 640. Processor 610 may access random access memory (RAM) 620 for programs and/or data, and may also access read only memory (ROM) for programs and/or data.

Portable computer system 600 optionally comprises a radio-frequency (RF) communications subsystem 640. RF communications system 640 is well suited to operate on a variety of radio communication protocols, including, for example, data and/or telephony networks, e.g., Bluetooth, WiFi, TDMA, CDMA, GSM, AMPS and the like. RF communications system 640, if present, operates to communicate voice, image and/or data to and from portable communication system 600.

Portable computer system 600 comprises a touch sensor subsystem 650. Touch sensor 650 may operate as a resistive or capacitive device, and generally functions to accept input to system 600 in the form of a touch, e.g., from a finger and/or a stylus. Touch sensor 650 is generally strongly associated with a display device. For example, a user of system 600 may perceive touching a "screen" rather than a separate touch sensor.

Portable computer system 600 also comprises a display device 670. Display 670 may be any suitable technology, including, for example, an STN or TFT LCD display device Display 670 functions to output images and/or alpha-numeric information from system 600

Portable computer system 600 further includes a light 680 to illuminate display 670. For example, most LCD devices do not directly produce light; rather such devices filter light from another source, e.g., light 680. Alternatively, light 680 may provide supplemental illumination when ambient light is insufficient for viewing display 670.

In accordance with embodiments of the present invention, light 680 comprises a plurality of light emitting diodes. Individual LEDs of plurality of light emitting diode devices 680 may correspond to assemblies previously described herein. For example, plurality of light emitting diode devices 680 may include instances of electronic devices 210, 211 (FIG. 2). It is appreciated that not all instances of plurality of light emitting diode devices 680 need be identical.

Light 680 may illuminate display 670 from the front and/or the back and/or the sides of display 670, and may be referred to as a front light, back light and/or side light. Light from light 680 may be coupled to the display by a diffuser in front of or behind display 670.

Embodiments in accordance with the present invention provide systems and methods for heat spreading substrate with embedded interconnects. In addition, embodiments in accordance with the present invention provide systems and methods for heat spreading substrate with embedded interconnects that are simple and cost effective to manufacture. Further, embodiments in accordance with the present invention provide systems and methods for heat spreading substrate with embedded interconnects that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A method comprising:
   wire bonding a plurality of wires to a substrate, said plurality of wires being a plurality of bond wires;
   filling a volume with an electrically and thermally conductive material, wherein said volume is in contact with said substrate and comprises said plurality of wires,
   wherein said electrically and thermally conductive material comprises a different grain structure from that of said plurality of wires.

2. The method of claim 1 further comprising coating said plurality of wires with a dielectric prior to said bonding.

3. The method of claim 1 further comprising placing a plurality of contacts on said substrate.

4. The method of claim 1 further comprising polishing a surface of said electrically and thermally conductive material to expose ends of said plurality of wires.

5. The method of claim 4 wherein said polishing electrically isolates at least two of said plurality of wires.

6. The method of claim 1 wherein said plurality of wires are electrically isolated from said electrically and thermally conductive material.

7. The method of claim 2 further comprising mounting an electronic device on a surface of said electrically and thermally conductive material.

8. The method of claim 7 wherein said electronic device comprises:
   first and second differentiated electrical contacts;
   wherein said first differentiated electrical contact is electrically coupled to one of said plurality of wires; and
   wherein said second differentiated electrical contact is electrically coupled to said electrically and thermally conductive material.

9. The method of claim 8 further comprising:
wire bonding said first differentiated electrical contact to one of said plurality of wires.

10. The method of claim 8 further comprising:
surface mounting said second differentiated electrical contact to said electrically and thermally conductive material.

11. The method of claim 1 wherein said filling comprises placing an electrically and thermally conductive material on said substrate, wherein said electrically and thermally conductive material has pre-existing holes to accommodate ball bonds of said plurality of wires.

* * * * *